US008017176B2

(12) United States Patent
Mulhollan et al.

(10) Patent No.: US 8,017,176 B2
(45) Date of Patent: Sep. 13, 2011

(54) ROBUST ACTIVATION METHOD FOR NEGATIVE ELECTRON AFFINITY PHOTOCATHODES

(76) Inventors: Gregory A. Mulhollan, Dripping Springs, TX (US); John C. Bierman, Austin, TX (US)

( * ) Notice: Subject to any disclaimer, the term of this patent is extended or adjusted under 35 U.S.C. 154(b) by 481 days.

(21) Appl. No.: 12/321,805

(22) Filed: Jan. 26, 2009

(65) Prior Publication Data

US 2009/0322222 A1 Dec. 31, 2009

Related U.S. Application Data

(60) Provisional application No. 61/062,146, filed on Jan. 25, 2008.

(51) Int. Cl.

| | |
|---|---|
| ***B05D 5/12*** | (2006.01) |
| ***H01J 9/12*** | (2006.01) |
| ***H01L 21/00*** | (2006.01) |
| *H01L 29/06* | (2006.01) |
| *H01L 29/12* | (2006.01) |

(52) U.S. Cl. ................ 427/74; 445/51; 438/20; 257/10; 257/11

(58) Field of Classification Search ........................ None
See application file for complete search history.

(56) References Cited

U.S. PATENT DOCUMENTS 2,770,561 A * 11/1956 Sommer ........................ 428/457
3,632,442 A * 1/1972 Turnbull .......................... 427/74
4,039,887 A * 8/1977 McDonie .................. 313/346 R
4,305,972 A * 12/1981 McDonie ......................... 427/10
5,471,051 A * 11/1995 Niigaki et al. .......... 250/214 VT
5,557,166 A * 9/1996 Watase et al. ................. 313/524
5,977,705 A * 11/1999 Sinor et al. .................... 313/542
6,162,707 A * 12/2000 Dinh et al. ..................... 438/487
6,235,615 B1 * 5/2001 Dinh et al. ..................... 438/487
6,597,112 B1 * 7/2003 Sillmon ......................... 313/542
6,998,635 B2 * 2/2006 Sillmon et al. .................. 257/10
2007/0176160 A1 * 8/2007 Uchiyama et al. .............. 257/10

OTHER PUBLICATIONS

Wada et al., Influence of Exposure to CO, CO2 and H2O on the Stability of GAAS Photocathodes, Japanese Journal of Applied Physics, vol. 29, No. 10, pp. 2087-2091, Aug. 29, 1990.*
Mulhollan et al., Recent Progress toward Robust Photocathodes, Spin Physics: 18th International Spin Physics Symposium, vol. 1149, pp. 1027-1031, Aug. 4, 2009.*
Mulhollan et al., Enhanced chemical immunity for negative electron affinity GaAs photoemitters, Journal of Vacuum Science & Technology, vol. 26, Issue 5, pp. 1195-1197, Aug. 6, 2008.*

(Continued)

*Primary Examiner* — Christina Johnson
*Assistant Examiner* — Benjamin Schiffman

(57) ABSTRACT

A method by which photocathodes(201), single crystal, amorphous, or otherwise ordered, can be surface modified to a robust state of lowered and in best cases negative, electron affinity has been discovered. Conventional methods employ the use of Cs(203) and an oxidizing agent(207), typically carried by diatomic oxygen or by more complex molecules, for example nitrogen trifluoride, to achieve a lowered electron affinity(404). In the improved activation method, a second alkali, other than Cs(205), is introduced onto the surface during the activation process, either by co-deposition, yo-yo, or sporadic or intermittent application. Best effect for GaAs photocathodes has been found through the use of Li(402) as the second alkali, though nearly the same effect can be found by employing Na(406). Suitable photocathodes are those which are grown, cut from boules, implanted, rolled, deposited or otherwise fabricated in a fashion and shape desired for test or manufacture independently supported or atop a support structure or within a framework or otherwise affixed or suspended in the place and position required for use.

20 Claims, 5 Drawing Sheets

OTHER PUBLICATIONS

Antonova et al., High-efficiency photocathodes on the NEA-GaAs basis, Applied Surface Science, vol. 111, pp. 237-240, Aug. 23, 1996.*

Iijima et al., A Study of Lifetime of NEA-GaAs Photocathode at Various Temperatures, Proceedings of IPAC'10, Kyoto, Japan, pp. 2323-2325, 2010.*

* cited by examiner

ROBUST ACTIVATION METHOD FOR NEGATIVE ELECTRON AFFINITY PHOTOCATHODES

CROSS-REFERENCE TO RELATED APPLICATION

This application claims the benefit of PPA Ser. No. 61/062,146 filed Jan. 25, 2008 by the present inventors, which is incorporated by reference.

FEDERALLY SPONSORED RESEARCH

This work was supported by the Department of Energy SBIR under Grant No. DE-FG02-07ER84832.

FIELD OF THE INVENTION

The present invention relates to a method for activating photocathodes to a state of lowered affinity such that they achieve said state and are less susceptible to diminished performance by the action of reactive gas then previous methods would allow. Specifically, the invention relates to the activation method of those materials ordinarily employing a single alkali to employ a second alkali in the process for enhanced robustness while maintaining high photoyield.

BACKGROUND

Negative electron affinity based photocathodes, often composed of group III-V elements, are used in many applications. In technological constructs, they are frequently employed as sensitive generators of photoelectrons fed into a cascade chain for signal amplification in photomultiplier tubes. Specialized negative electron affinity photocathode based tubes are used for low level light amplification in night-vision goggles and sights. Scientific applications include use as sources of spin-polarized and ultra-cold electrons. In all cases, the photocathode is activated to lower its electron affinity, thereby enabling photoelectrons to be emitted via excitation by relatively low energy visible and near infrared photons.

Activated photocathodes are restricted to operation in the very best ultra-high vacuum environments so that they exhibit stable operation over long periods. In sealed tubes, exposure is limited to gas generated from internal components through electron bombardment and heating. When used as a bolt-on electron source, the gas load may be compounded by connection to vacuum systems with higher pressures than the source. A major problem in the preparation and use of these photocathodes is the relatively high chemical reactivity of both the clean and activated III-V photocathode surfaces. There has been relatively little successful work to date to enhance the chemical immunity of activated III-V photocathodes. Earlier efforts to work around reactive gas susceptibility have included encapsulating the photocathode and overcoating with antimony. Both methods result in, at best, some decreased yield, and most problematic, a complicated preparation apparatus not easily integratable into existing systems. Prior to this invention, no satisfactory method had been developed so that GaAs and other III-V based photoemitters could be activated in a similar fashion to that currently employed in common practice while resulting in a surface that is significantly more stable against reactive gas driven photoyield decay.

GaAs photoemitters are activated to the negative electron affinity state by first starting with an atomically clean surface. Such a surface is obtained by chemical treatment, frequently followed by heating once the photoemitter has been introduced into a vacuum environment. Activation consists of the deposition of a low work function metal, such as a group IA alkali, followed or interleaved with an oxidizing agent onto the clean surface. The lowest affinities are obtained using Cs as the alkali and either oxygen or fluorine as the oxidizer. Low coverage of Cs is commensurate with the underlying lattice on some surfaces, but at the coverage required for activation, the layer is amorphous, due in part to the large covalent radius of the Cs atoms. Studies of the deposition process have shown that the initial oxygen absorption sites are between the Cs atoms. Together these facts suggest that if access to the underlying oxidizer and photocathode surface could be blocked during the activation process, but after the Cs and oxidizer atoms are in place, then absorbed gas induced decay could be inhibited. The covalent radius of the group IA elements decreases moving up the column from Cs to Li. A second, smaller covalent radius alkali could be used as blocking atoms if those atoms adsorb in an advantageous location and do not have a deleterious effect on the quantum yield.

A method based on two alkali photocathode activation would have great utility in all applications of lowered and negative electron affinity based photocathodes. Decreased lifetime sensitivity to reactive gas would enhance the shelf- and operational-lifetimes of photomultiplier and night vision tubes. Decreased sensitivity to reactive gas would allow the use of bolt-on negative electron affinity photocathode sources on systems where they are currently unable to operate due to the high reaction rate with many background gasses. The use of an activation process parallel to the current one that employs Cs alone would make integration into existing systems straightforward and convenient.

SUMMARY OF THE INVENTION

An object of the invention is to overcome at least some of the drawbacks relating to the methods of prior art as discussed above.

Hence, a method is provided by which photocathodes, single crystal, amorphous, or otherwise ordered, can be surface modified to a state of lowered and in best cases negative, electron affinity with enhanced immunity to reactive gas. Conventional methods employ the use of Cs and an oxidizing agent, typically carried by diatomic oxygen or by more complex molecules, for example nitrogen trifluoride, to achieve a lowered electron affinity.

In the improved activation method, a second alkali, other than Cs, is introduced onto the surface during the activation process, either by co-deposition, yo-yo, or sporadic or intermittent application. Best effect for GaAs photocathodes can been found through the use of Li as the second alkali, though nearly the same effect can be found by employing Na. Suitable photocathodes are those which are grown, cut from boules, implanted, rolled, deposited or otherwise fabricated in a fashion and shape desired for test or manufacture independently supported or atop a support structure or within a framework or otherwise affixed or suspended in the place and position required for use.

The ensuing activation process has been shown to exhibit improved reactive gas immunity and improved photoyield at the band gap and away from the band gap.

Carbon dioxide is a gas know to have an extremely deleterious effect on the photoyield of photocathodes, especially those based on the III-V column elements, e.g., GaAs. For background gas levels in the ultra-high vacuum range, photoemitters activated using both the standard and improved methods exhibit no yield change on the time scale of hours. For exposure to carbon dioxide at the 1.0 E-11 Torr level or greater, the photoyield of a standard activated photocathode decays at a much greater rate than that of a photocathode activated with the improved method.

The photoyield with the improved activation method, over the range of yields that are used or outside the range of interest, is brought about by the changed surface chemistry of the improved activation method. The yield is not necessarily improved over all possible emission wavelengths. Photoyield of GaAs activated with the improved method may exhibit an improvement of up to, or greater than, 60% over that obtained using the standard method of activation.

The alkali atoms can be applied by molecular beam, effusion cell, ampule source, dispensing cathode, pyrolysis, ultra-violet enacted or otherwise, mechanical affixation, rolling, settling, direct atomic placement or any other method resulting in the intimate contact of the alkali atoms with the surface of the photoemitter.

The oxidizing agent can be brought to the surface by exposure to reactive gas containing the desired quality, direct infusion through the photoemitter, deliberate exposure by admitting gas through a controlled leak, valve or membrane, catalytic or chemical reaction in the vessel containing or connected to the photoemitter or any other method which produces a necessary partial pressure or freely migrating atoms of the oxidizing agent in such a manner as to allow it to react with the photoemitter surface.

In other aspects, the invention provides a method of photocathode activation having features and advantages corresponding to those discussed above.

BRIEF DESCRIPTION OF THE DRAWINGS

The present invention is illustrated by way of example and not limitation in the accompanying figures.

DETAILED DESCRIPTION OF THE INVENTION

The present inventions now will be described more fully hereinafter with reference to the accompanying drawings, in which some examples of the embodiments of the inventions are shown. Indeed, these inventions may be embodied in many different forms and should not be construed as limited to the embodiments set forth herein; rather, these embodiments are provided by way of example so that this disclosure will satisfy applicable legal requirements. Like numbers refer to like elements throughout.

Figure 1:
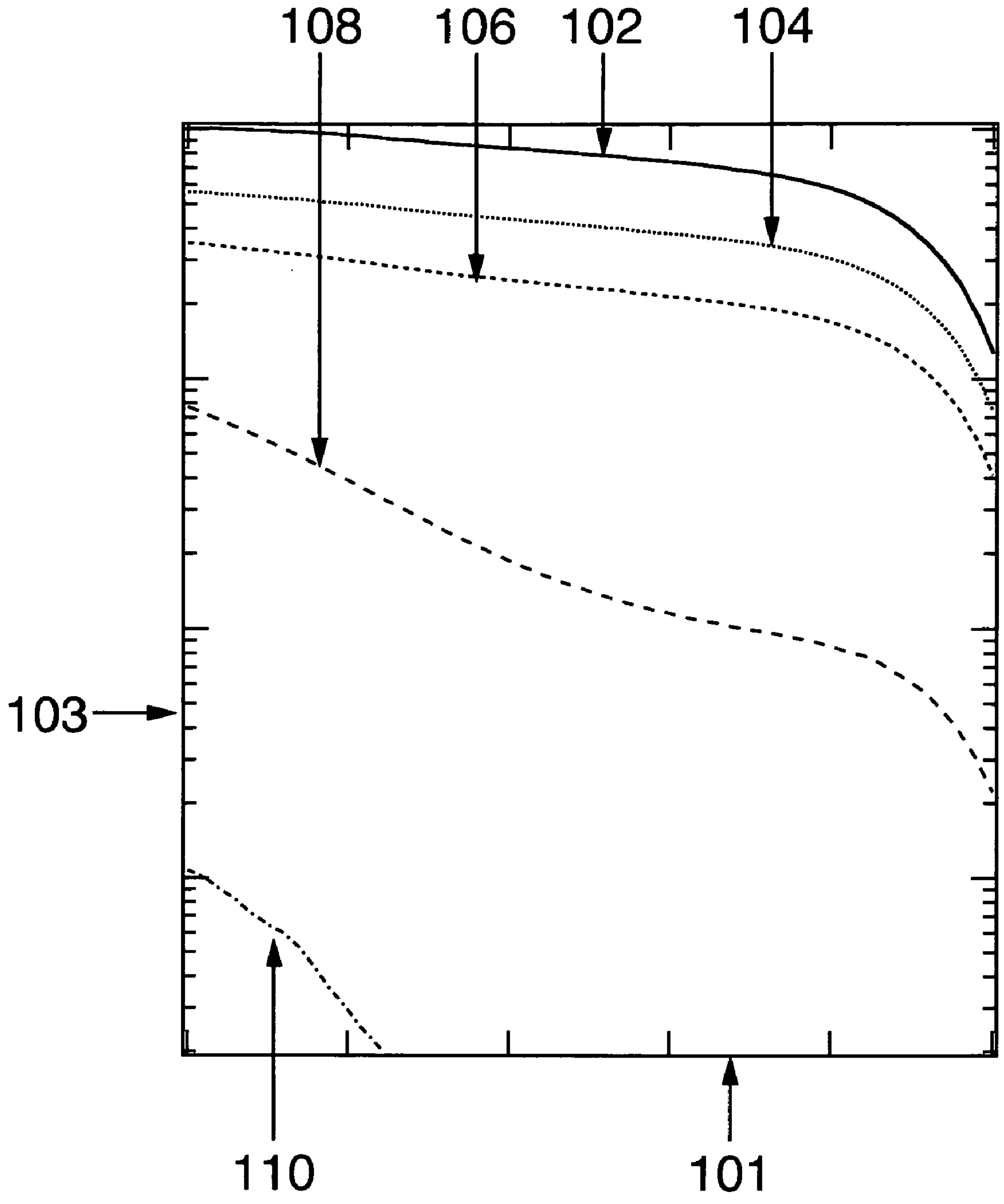
FIG. 1 shows the quantum yield as a function of wavelength for bulk GaAs activated with the first five alkali metals of group IA and nitrogen trifluoride.

FIG. 1 illustrates the photoyield obtained from activated GaAs 201 using the methods familiar to practitioners of the art. The abscissa 101 represents the wavelength and the ordinate 103 represents logarithmically the photoelectron quantum yield, or photoyield, as measured in reflection mode. The abscissa 101 covers a range of 650 through 900 nm. The ordinate 103 covers a range of 0.001 percent to 10 percent quantum yield. The photoyield as obtained from single crystal GaAs with an orientation of (001) using the standard activation method, employing Cs 102 comprises the first curve. The photoyield as obtained from single crystal GaAs with an orientation of (001) using the standard activation method, employing Rb 104 comprises the second curve. The photoyield as obtained from single crystal GaAs with an orientation of (001) using the standard activation method, employing K 106 comprises the third curve. The photoyield as obtained from single crystal GaAs with an orientation of (001) using the standard activation method, employing Na 108 comprises the fourth curve. The photoyield as obtained from single crystal GaAs with an orientation of (001) using the standard activation method, employing Li 110 comprises the fifth curve. As the alkali employed in the standard method comes from higher in the group IA column, the photoyield diminishes. The obvious choice for activation of photoemitters is Cs 102 which results in the greatest quantum yield. Use of Li 110 in the activation process for the depicted photocathodes would be considered unobvious to practitioners of the art.

Figure 2:
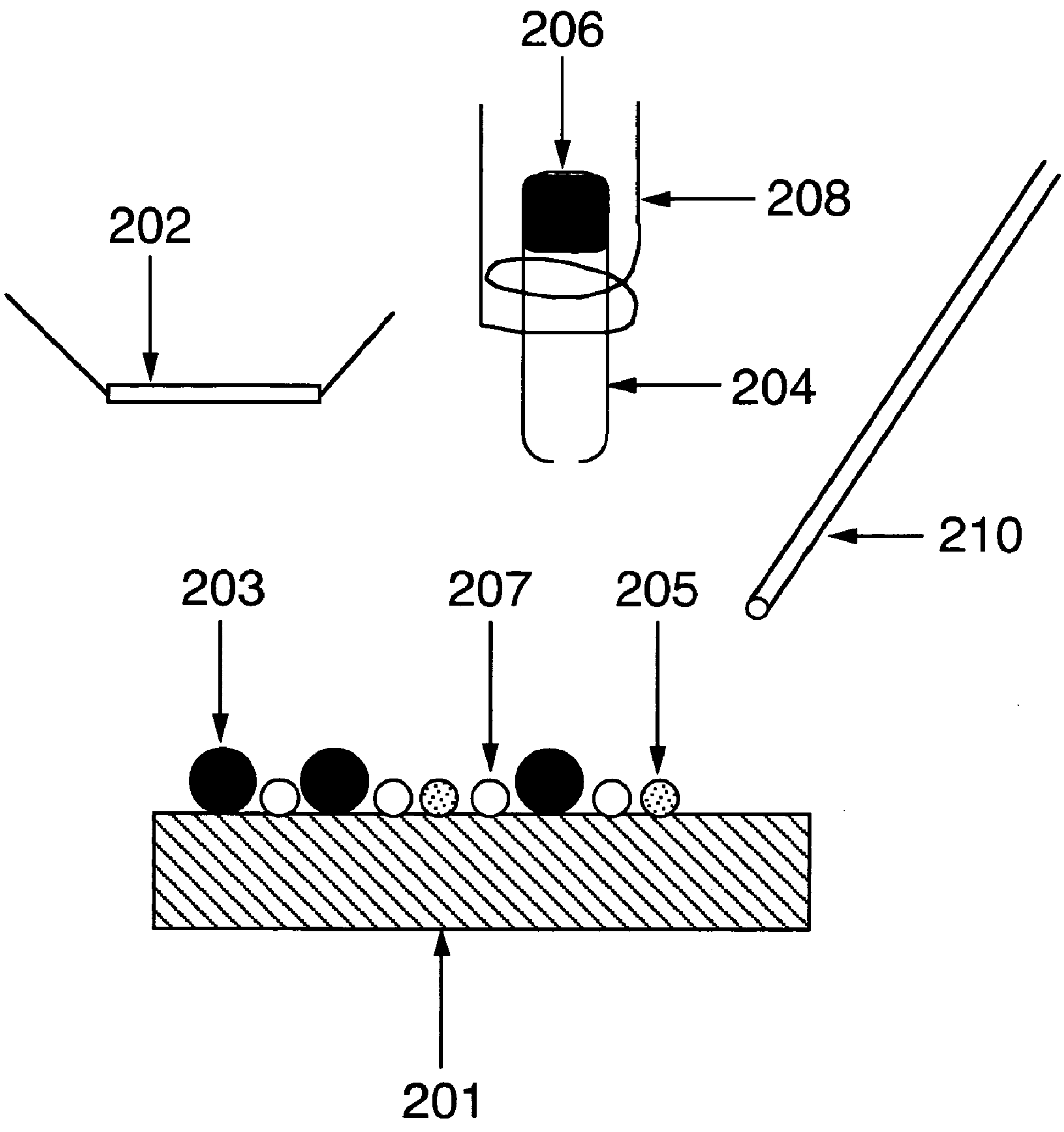
FIG. 2 schematically represents the deposition process and necessary equipment for activating photocathodes with the improved method.

Turning now to FIG. 2, the method of activation and one embodiment of the method is shown. GaAs photoemitters 201 are activated to the negative electron affinity state by first starting with an atomically clean surface. Such a surface is obtained by chemical treatment, frequently followed by heating once the photoemitter has been introduced into a vacuum environment. Activation consists of the deposition of a low work function metal, such as a group IA alkali 203, followed or interleaved with an oxidizing agent 207 onto the clean surface. The lowest affinities are obtained using Cs 203 as the alkali and either oxygen 207 or fluorine 207 as the oxidizer. Low coverage of Cs 203 is commensurate with the underlying lattice 201 on some surfaces, but at the coverage required for activation, the layer is amorphous, due in part to the large covalent radius of the Cs 203 atoms. Studies of the deposition process have shown that the initial oxygen 207 absorption sites are between the Cs 203 atoms. Together these facts suggest that if access to the underlying oxidizer 207 and photocathode surface 201 could be blocked during the activation process, but after the Cs 203 and oxidizer 207 atoms are in place, then absorbed gas induced decay could be inhibited. The covalent radius of the group IA elements decreases moving up the column from Cs 203 to Li 205. A second, smaller covalent radius alkali 205 could be used as blocking atoms 205 if those atoms adsorb in an advantageous location and do not have a deleterious effect on the quantum yield. In this embodiment, the alkali atoms are generated either by a resistively heated channel source 202 or by emission from an ampule 204 containing the alkali 206 which is released by heat supplied by a enveloping filament 208. Deposition rate is adjusted by the current through the channel source 202 or by the current through the filament 208. The alkali atoms 203, 205 can be applied by molecular beam, effusion cell, ampule source, dispensing cathode, pyrolysis, ultra-violet enacted or otherwise, mechanical affixation, rolling, settling, direct atomic placement or any other method resulting in the intimate contact of the alkali atoms with the surface of the photoemitter.

In this embodiment, the oxidizer 207 atoms can be delivered through the vacuum envelope into a tube 210 providing directional collimation for the carrier gas, or be admitted without same. The oxidizing agent 207 can be brought to the surface 201 by exposure to reactive gas containing the desired quality, direct infusion through the photoemitter, deliberate exposure by admitting gas through a controlled leak, valve or membrane, catalytic or chemical reaction in the vessel containing or connected to the photoemitter or any other method which produces a necessary partial pressure or freely migrating atoms of the oxidizing agent 207 in such a manner as to allow it to react with the photoemitter surface 201.

Figure 3:
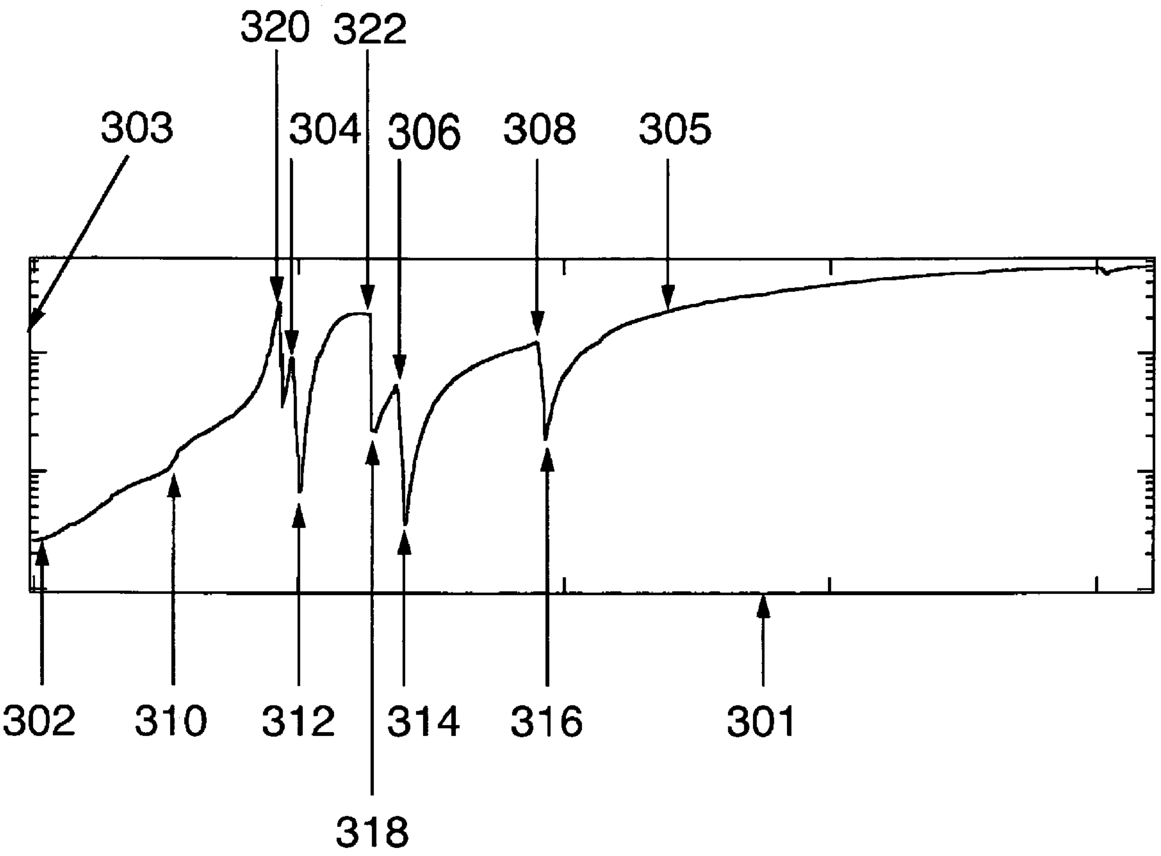
FIG. 3 shows an example of the activation process timeline to obtain the improved photocathode.

An example activation curve 305 incorporating the method for applying the second alkali during the activation so as to result in improved reactive gas immunity and enhanced quantum yield is illustrated in FIG. 3. The abscissa 301 represents time as measured on a strip-chart recorder or other time marking device and the ordinate 303 represents logarithmically the photoelectron current as measured in reflection mode using a light source having a wavelength of 632.8 nm. The abscissa 301 covers a period of 45 minutes. The ordinate 303 covers a range of 1 to 450 nA. At the start of the activation 302, both the Cs and Li alkali sources 202 are delivering alkali atoms 203, 205 to the clean GaAs surface 201. At the time 310 the Li source 202 is turned off. The activation is allowed to continue with the usual rise in photocurrent until the value 300 nA is exceeded at which time 320 an ND1 neutral density filter is inserted into the path of the exciting light source. When the photocurrent next exceeds 50 nA 304 the Li source 202 is re-energized and remains on until 312 the photocurrent has dropped by a factor of approximately ten. The activation is allowed to continue with the usual rise in photocurrent until the value 300 nA is exceeded at which time 322 an ND2 neutral density filter is inserted into the path of the exciting light source. When the photocurrent next exceeds 50 nA 306, as assisted 318 by the application 210 of the oxidizing agent 207, the Li source 202 is re-energized and remains on until 314 the photocurrent has dropped by a factor of approximately ten. When the photocurrent next exceeds 50 nA 308, as assisted 318 by the application 210 of the oxidizing agent 207, the Li source 202 is re-energized and remains on until 316 the photocurrent has dropped by a factor of approximately ten. The activation is then completed with Cs 203 and the oxidizing agent 207 alone in the fashion familiar to practitioners of the art. This embodiment of the activation process serves as an example and does not limit the time, steps, sequencing or other alterations which lead to the presence of two alkali atom types, Cs 203 and one other 205, on the surface 201 of the photocathode and an improved immunity to reactive gas.

Figure 4:
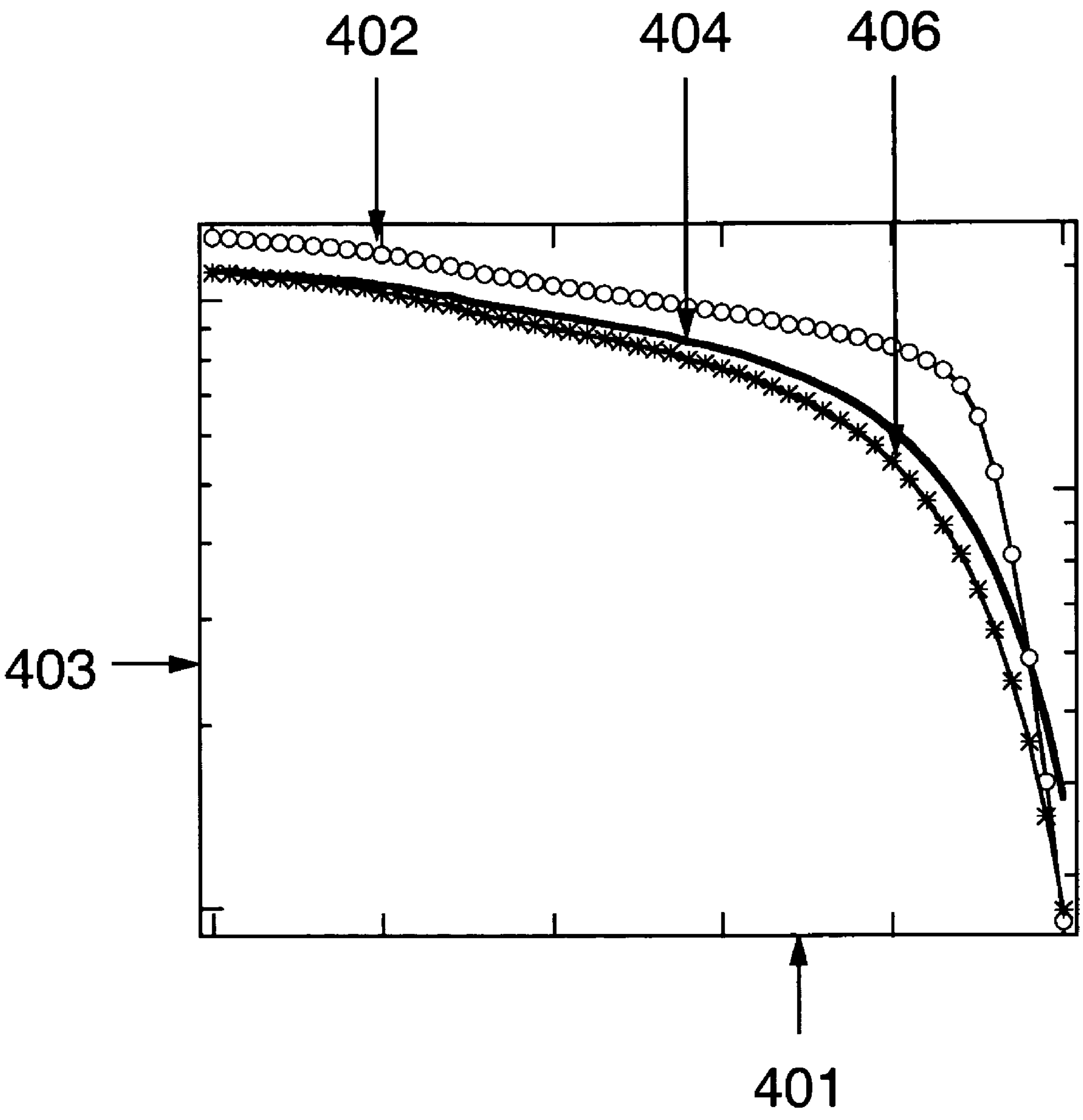
FIG. 4 illustrates the quantum yield as a function of wavelength for bulk GaAs using the standard and improved activation methods.

FIG. 4 illustrates the photoyield obtained from activated GaAs 201 using the method familiar to practitioners of the art and the new method. The abscissa 401 represents the wavelength and the ordinate 403 represents logarithmically the photoelectron quantum yield, or photoyield, as measured in reflection mode. The abscissa 401 covers a range of 650 through 900 nm. The ordinate 403 covers a range of 1 percent to 12 percent quantum yield. The photoyield as obtained from single crystal GaAs with an orientation of (001) using the standard activation method, employing Cs 404 comprises the first curve. The photoyield as obtained from single crystal GaAs with an orientation of (001) using the new activation method, employing Cs and Li 402 comprises the second curve. The photoyield as obtained from single crystal GaAs with an orientation of (001) using the new activation method, employing Cs and Na 406 comprises the third curve. The new method of activation using Cs and Li 402 results in improved resistance to reactive gas as well as improvement in the overall yield. To practitioners of the art familiar with the results of Li used alone 110 for activating GaAs, this result is unobvious.

Figure 5:
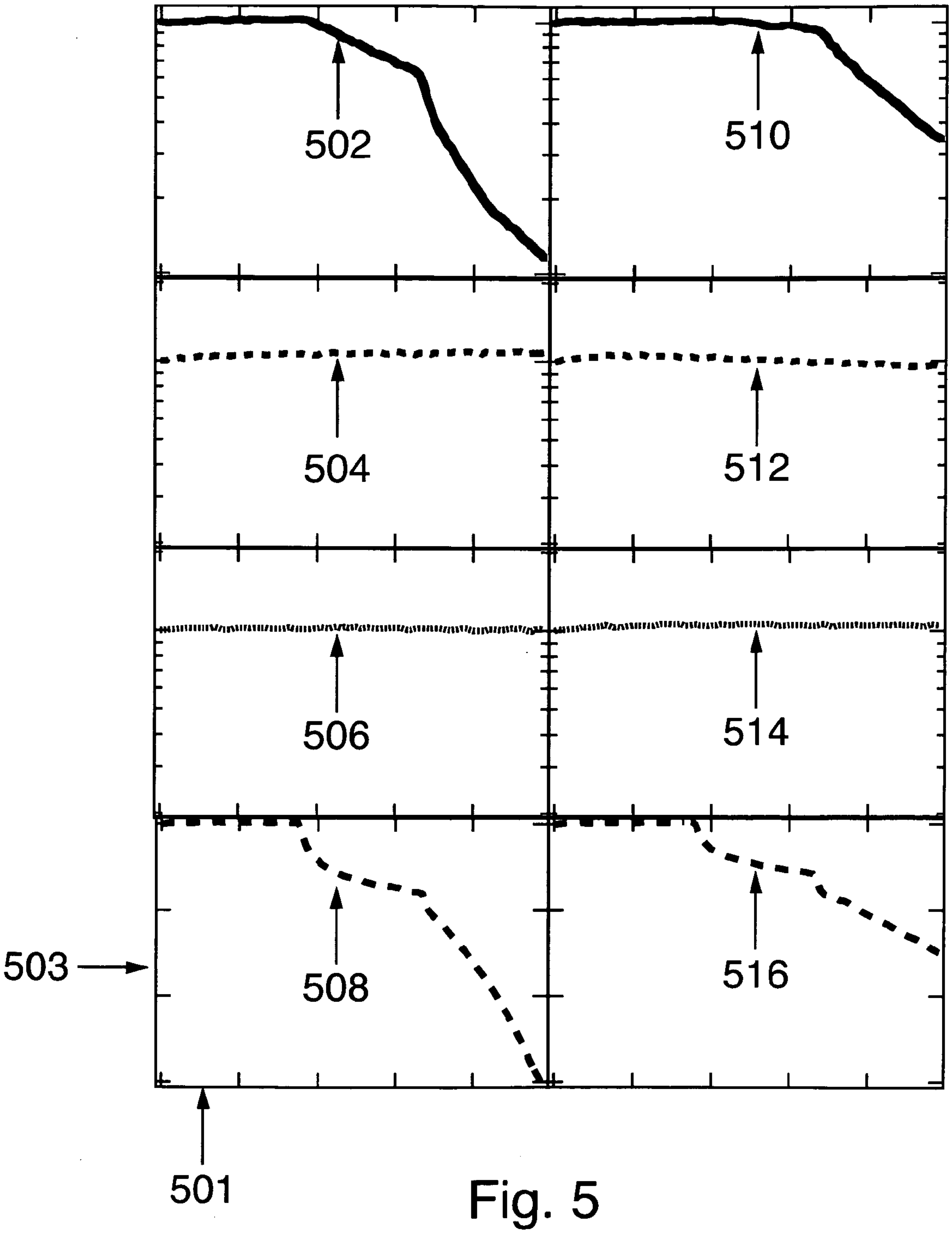
FIG. 5 shows examples of the robustness to gas exposure of the photocathode activated using the improved method compared to that of the photocathode using the standard method.

Turning now to FIG. 5, the robustness against reactive gas is proven to be a result of the new method of activation. The abscissa 501 represents time and the ordinate 503 represents logarithmically the normalized photoelectron quantum yield, or photoyield, as measured in reflection mode. The abscissa 501 of each subplot covers a range of approximately 90 minutes. The ordinate 503 covers a range of normalized quantum yield as indicated by the ordinate marking. The time axis is broken into three parts. The first 30 minutes corresponds to background gas exposure, the second and third to 30 minute exposures at 1.5E-10 Torr and 5.0E-10 Torr of the dosing gas, respectively. The left curves, 502, 504, 506 and 508 represent gas exposures for photocathode activated in the standard method. The right curves, 510, 512, 514 and 516 represent gas exposures for photocathode activated in the new method. The upper pair of curves represent exposure to carbon dioxide for cathodes activated in the standard 502 and new 510 method. At the end of the carbon dioxide exposure, the photocathode activated in the new method retained a yield more than six times greater than that for the standard activated photocathode. The next pair of curves represent exposure to methane for cathodes activated in the standard 504 and new 512 method. Neither cathode evinced reaction to this gas. The low reactivity of methane is familiar to practitioners of the art. The next pair of curves represent exposure to carbon monoxide for cathodes activated in the standard 506 and new 514 method. Neither cathode evinced reaction to this gas. The low reactivity of carbon monoxide is familiar to practitioners of the art. The lowest pair of curves represent exposure to diatomic oxygen for cathodes activated in the standard 508 and new 516 method. At the end of the diatomic oxygen exposure, the photocathode activated in the new method retained a yield more than forty times greater than that for the standard activated photocathode.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific examples of the embodiments disclosed and that modifications and other embodiments are intended to be included within the scope of the appended claims. Although specific terms are employed herein, they are used in a generic and descriptive sense only and not for purposes of limitation.

The invention claimed is:

1. A method for activating photocathodes to a state of lowered electron affinity such that they achieve said state and are less susceptible to diminished performance by the action of reactive gas and enhanced robustness while maintaining high photoyield, comprising:

providing a photocathode with a surface;

delivering a first and second alkali to the photocathode's surface; and delivering an oxidizer to the photocathode's surface.

2. The method according to claim 1, wherein the first alkali is cesium and the second alkali is lithium.

3. The method according to claim 1, wherein the first alkali is cesium and the second alkali is sodium.

4. The method according to claim 1, wherein the oxidizer is oxygen.

5. The method according to claim 1, wherein the oxidizer is fluorine.

6. The method according to claim 1, wherein the alkali atoms are delivered by channel source.

7. The method according to claim 1, wherein the alkali atoms are delivered by ampule.

8. The method according to claim 1, wherein the alkali atoms are delivered by molecular beam.

9. The method according to claim 1, wherein the alkali atoms are delivered by effusion cell.

10. The method according to claim 1, wherein the alkali atoms are delivered by dispensing cathode.

11. The method according to claim 1, wherein the alkali atoms are delivered by pyrolysis, ultra-violet enacted or otherwise.

12. The method according to claim 1, wherein the alkali atoms are delivered by mechanical affixation.

13. The method according to claim 1, wherein the alkali atoms are delivered by rolling.

14. The method according to claim 1, wherein the alkali atoms are delivered by direct atomic placement.

15. The method according to claim 1, wherein the alkali atoms and oxidizer are delivered via co-deposition.

16. The method according to claim 1, wherein the alkali atoms and oxidizer are delivered via yo-yo deposition.

17. The method according to claim 1, wherein the alkali atoms and oxidizer are delivered via sporadic deposition.

18. The method according to claim 1, wherein the alkali atoms and oxidizer are delivered via intermittent deposition.

19. The method according to claim 1, wherein an oxidizer carrier gas is diatomic oxygen.

20. The method according to claim 1, wherein an oxidizer carrier gas is nitrogen trifluoride.

* * * * *